(12) United States Patent
Hussain et al.

(10) Patent No.: US 9,520,293 B2
(45) Date of Patent: Dec. 13, 2016

(54) METHOD FOR PRODUCING MECHANICALLY FLEXIBLE SILICON SUBSTRATE

(75) Inventors: Muhammad M. Hussain, Austin, TX (US); Jhonathan P. Rojas, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 14/238,526

(22) PCT Filed: Aug. 15, 2012

(86) PCT No.: PCT/US2012/050847
§ 371 (c)(1),
(2), (4) Date: Apr. 2, 2014

(87) PCT Pub. No.: WO2013/025748
PCT Pub. Date: Feb. 21, 2013

(65) Prior Publication Data
US 2014/0239459 A1    Aug. 28, 2014

Related U.S. Application Data

(60) Provisional application No. 61/523,606, filed on Aug. 15, 2011.

(51) Int. Cl.
*H01L 21/02* (2006.01)
*H01L 21/336* (2006.01)
(Continued)

(52) U.S. Cl.
CPC ... *H01L 21/30604* (2013.01); *H01L 21/02005* (2013.01); *H01L 21/02109* (2013.01); *H01L 23/564* (2013.01); *H01L 2924/0002* (2013.01)

(58) Field of Classification Search
CPC ......... H01L 21/306; H01L 21/02; H01L 23/00
(Continued)

(56) References Cited

U.S. PATENT DOCUMENTS 4,601,779 A      7/1986   Abernathey et al.
5,220,838 A  *   6/1993   Fung et al. ............. 73/721
(Continued)

FOREIGN PATENT DOCUMENTS

CN          1697140         11/2005
CN         101064250 A      10/2007
(Continued)

OTHER PUBLICATIONS

Reiche et al., "Wafer Thinning: Techniques for Ultra-thin Wafers", Advanced Packaging, vol. 12, No. 3, Mar. 2003.*
(Continued)

*Primary Examiner* — Kimberly Rizkallah
*Assistant Examiner* — Brian Turner
(74) *Attorney, Agent, or Firm* — Norton Rose Fulbright US LLP

(57) ABSTRACT

A method for making a mechanically flexible silicon substrate is disclosed. In one embodiment, the method includes providing a silicon substrate. The method further includes forming a first etch stop layer in the silicon substrate and forming a second etch stop layer in the silicon substrate. The method also includes forming one or more trenches over the first etch stop layer and the second etch stop layer. The method further includes removing the silicon substrate between the first etch stop layer and the second etch stop layer.

14 Claims, 8 Drawing Sheets

(51) Int. Cl.
*H01L 21/70* (2006.01)
*H01L 21/76* (2006.01)
*H01L 21/302* (2006.01)
*H01L 21/306* (2006.01)
*H01L 23/00* (2006.01)

(58) Field of Classification Search
USPC . 438/694, 299, 386, 700, 704; 257/E21.223, 257/E21.232; 378/34
See application file for complete search history.

(56) References Cited

U.S. PATENT DOCUMENTS

| | | | | |
|---|---|---|---|---|
| 5,583,368 | A | * | 12/1996 | Kenney ............... H01L 27/0922 257/302 |
| 2002/0185469 | A1 | * | 12/2002 | Podlesnik et al. .............. 216/41 |
| 2004/0077163 | A1 | * | 4/2004 | Chang ................ H01L 21/0335 438/689 |
| 2004/0130015 | A1 | | 7/2004 | Ogihara ..................... B41J 2/45 257/678 |
| 2004/0248380 | A1 | | 12/2004 | Aulnette et al. |
| 2005/0148147 | A1 | * | 7/2005 | Keating et al. .............. 438/299 |
| 2006/0094255 | A1 | * | 5/2006 | Sekine et al. ................ 438/775 |
| 2007/0096148 | A1 | * | 5/2007 | Hoentschel et al. .......... 257/192 |
| 2007/0238250 | A1 | * | 10/2007 | Zhang ............... H01L 21/76254 438/262 |
| 2008/0050858 | A1 | | 2/2008 | Ono et al. |
| 2008/0099840 | A1 | * | 5/2008 | Enicks ............. H01L 21/30608 257/347 |
| 2009/0096089 | A1 | | 4/2009 | Burghartz et al. |
| 2011/0000060 | A1 | | 1/2011 | Lee et al. |
| 2011/0092069 | A1 | * | 4/2011 | Cheng et al. ................. 438/672 |

FOREIGN PATENT DOCUMENTS

| | | |
|---|---|---|
| JP | 2004-055752 A | 2/2004 |
| JP | 2007227527 | 9/2007 |
| JP | 2008187061 | 8/2008 |
| WO | 2007072406 A1 | 6/2007 |

OTHER PUBLICATIONS

Shaw et al., SCREAM I: A single mask, single-crystal silicon, reactive ion etching process for microelectromechanical structures, Sensors and Actuators A., Jan. 1, 1994, vol. 40, No. 1, pp. 63-70.

Chhabra et al., 12.4% efficient freestanding 30mm ultra-thin silicone solar cell usijng a-Si/c-Si Heterostructure, 35th IEEE Photovoltaic Specialists Conference (PVCS), Jun. 20-25, 2010, Honolulu, Hawaii.

Huang et al., Fabrication of ultrathin P++ silicon microstructures using ion implantation and boron etch-stop, Journal of Microelectromechanical Systems, Dec. 1, 2001, vol. 10, No. 4, pp. 532-537.

* cited by examiner

METHOD FOR PRODUCING MECHANICALLY FLEXIBLE SILICON SUBSTRATE

CROSS-REFERENCE TO RELATED APPLICATIONS

This application is a national phase application under 35 U.S.C. §371 that claims priority to PCT Application No. PCT/US2012/050847 to King Abdullah University of Science and Technology filed Aug. 15, 2012, which claims priority to U.S. Provisional Patent Application Ser. No. 61/523,606, filed Aug. 15, 2011, the entire contents of both of which are incorporated herein by reference. This application also claims priority to International Patent Application No. PCT/US2012/046205, filed Jul. 11, 2012, which claims priority to U.S. Provisional Patent Application Ser. No. 61/506,495, filed Jul. 11, 2011, the entire contents of both of which are incorporated herein by reference.

BACKGROUND OF THE INVENTION

Field of the Invention

This invention relates to fabrication of miniature structures and more particularly relates to method for producing mechanically flexible silicon substrate.

Description of the Related Art

Nanostructured elements of single-crystal silicon, in the form of substrates, wires, ribbons, and particles, are of interest for a number of applications in electronics, optoelectronics, sensing, and other areas. Stretchable and easily deployable silicon based integrated circuits (ICs) will facilitate the development of many new technologies in the areas of implantable biomedical applications, renewable energy, sensors and smart cards.

Approaches that rely on the lithographic processing of top surfaces of semiconductor wafers enable well-controlled thicknesses, widths, lengths, and crystallinity. These methods can form membranes, tubes, and ribbons, with thicknesses in the micrometer to nanometer range.

One common practice to fabricate mechanically flexible nanoribbons (substrate) is to use wet etching on a (111) Si or silicon-on-insulator (SOI) wafer and then transfer the product onto a plastic substrate. However, cost of the process is high due to the use of high-cost (111) Si or SOI wafer. Another similar common practice to fabricate mechanically flexible substrate is to use a back grinding process. Back grinding eliminates the potential to recycle the remaining part of the wafer that is not included in final product of the mechanically flexible substrate. Therefore, there exists a need for low lost fabrication of mechanically flexible mechanically flexible silicon substrate.

SUMMARY OF THE INVENTION

A method for making mechanically flexible silicon substrates is disclosed. In one embodiment, the method may include providing a silicon substrate, forming a first etch stop layer in the silicon substrate, forming a second etch stop layer in the silicon substrate, forming one or more trenches over the first etch stop layer and the second etch stop layer and removing the silicon substrate between the first etch stop layer and the second etch stop layer.

In one embodiment, forming a first etch stop layer may include ion implantation. The first etch stop layer may include a Boron layer. In one embodiment, forming a second etch stop layer may also include ion implantation. The second etch stop layer may include a Boron layer. In one embodiment, forming one or more trenches may include forming a protective layer over the silicon substrate. The method may also include etching the protective layer and a portion of the silicon substrate. The method may further include forming a vertical sidewall layer inside each of the one or more trenches. In one embodiment, the method may include removing the protective layer. The method may also include removing the vertical sidewall formation film layer.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1:
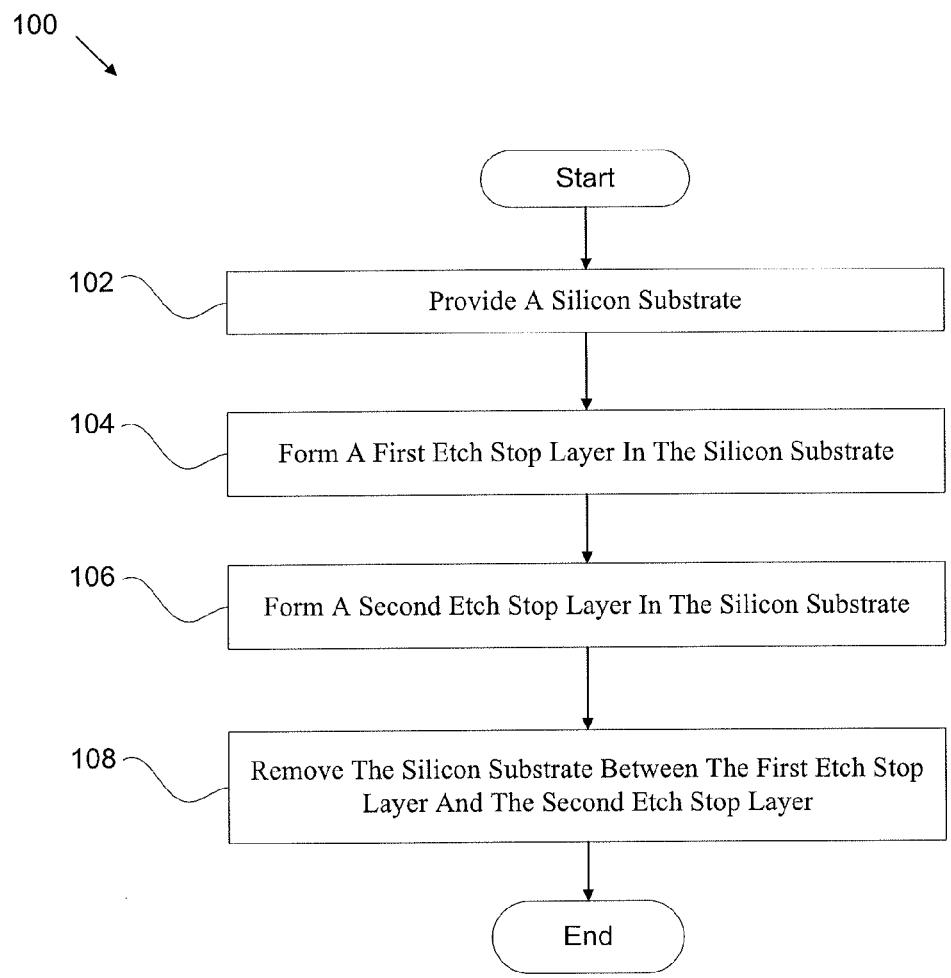
FIG. 1 is a schematic diagram illustrating one embodiment of a method for making a mechanically flexible silicon substrate.

FIG. 1 illustrates one embodiment of a method 100 for making a mechanically flexible silicon substrate. FIG. 3 shows the products produced by each step of the method 100. In one embodiment, the method may include providing 102 a silicon substrate 302, as shown in FIG. 3. The method 100 may further include forming 104 a first etch stop layer 304 in the silicon substrate. In one embodiment, forming the first etch stop layer 304 may include ion implantation. In one embodiment, the ion implantation may be a high energy boron implantation ($1E20/cm^3$).

In one embodiment, the method 100 may further include forming 106 a second etch stop layer 306 in the silicon substrate. In one embodiment, forming the second etch stop layer 306 may include ion implantation. In one embodiment, the ion implantation may be a high energy boron implantation ($1E20/cm^3$). The second etch stop layer 306 may be configured to be parallel to the first etch stop layer 304. In such an embodiment, a silicon layer may be formed between the first etch stop layer 304 and the second etch stop layer 306. The positions of the first etch stop layer 304 and the second etch stop layer 306 may be configured to control the depth of the mechanically flexible silicon substrate.

In one embodiment, the method 100 may further include removing 108 the silicon layer between the first etch stop layer 304 and the second etch stop layer 306. In one embodiment, removing the silicon layer between the first etch stop layer 304 and the second etch stop layer 306 my include wet etching of silicon using hydrazine.

In one embodiment, the silicon substrate formed by method 100 may mechanical flexible. In one embodiment, the silicon substrate formed by method 100 may be optically transparent. The silicon substrate formed by method 100 may also be porous. In another embodiment, the method 100 may also be used to produce high performance electronics directly on flexible silicon without any transfer or such process.

Figure 2:
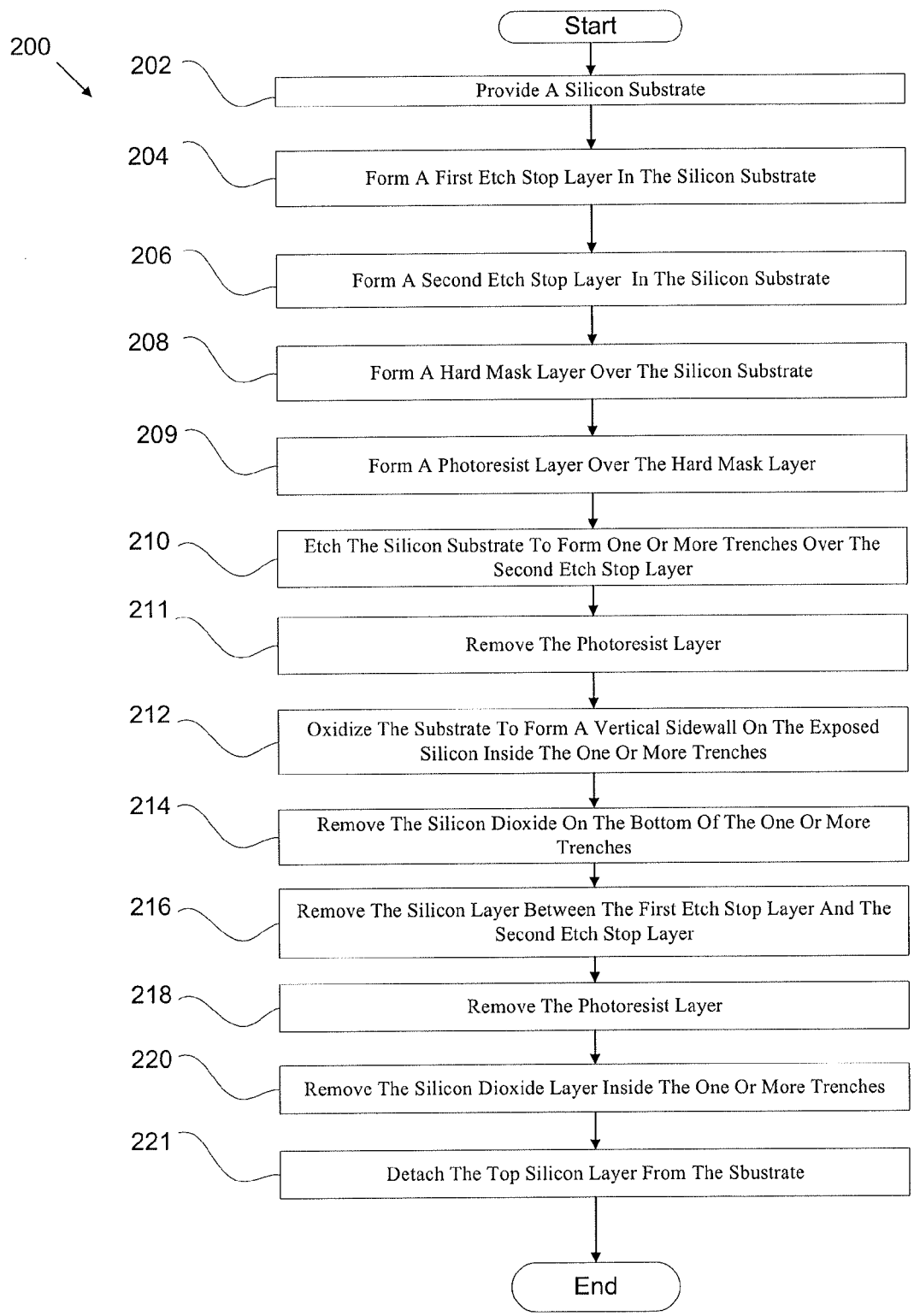
FIG. 2 is a schematic flow chart illustrating one embodiment of a method for making a mechanically flexible silicon substrate.

FIG. 2 illustrates one embodiment of a method 200 for making a mechanically flexible silicon substrate. FIG. 3 shows the corresponding products produced by each step of the method 200. In one embodiment, the method 200 may include providing 202 a silicon substrate 302. The method 200 may also include forming 204 a first etch stop layer 304 in the silicon substrate 302. In one embodiment, forming the first etch stop layer 304 in the silicon substrate 302 may include ion implantation. In one embodiment, the ion implantation may be a high energy boron implantation ($1E20/cm^3$).

In one embodiment, the method 200 may further include forming 206 a second etch stop layer 306 in the silicon substrate 302. The second etch stop layer 306 may be formed over the first etch stop layer 304. In one embodiment, forming the second etch stop layer 306 in the silicon substrate 302 may include ion implantation. In one embodiment, the ion implantation may be a high energy boron implantation ($1E20/cm^3$).

Figure 3A:
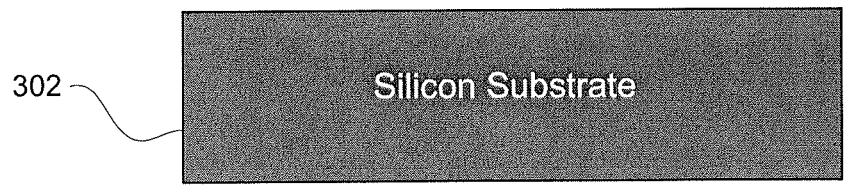
FIGS. 3A-3J are schematic cross-section diagrams illustrating step-by-step products of a method for making a mechanically flexible silicon substrate.
Figure 3B:
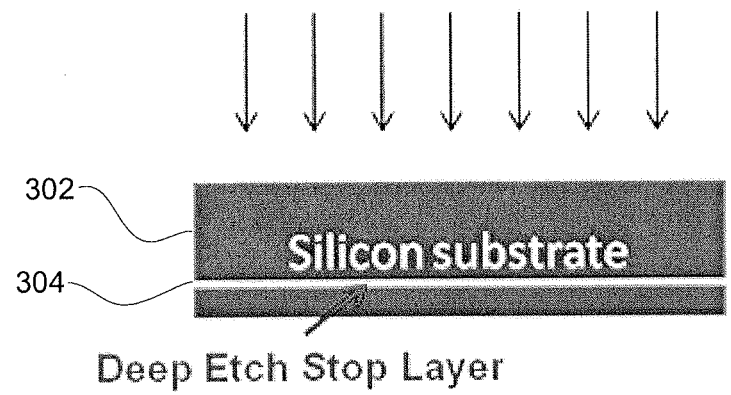
Figure 3C:
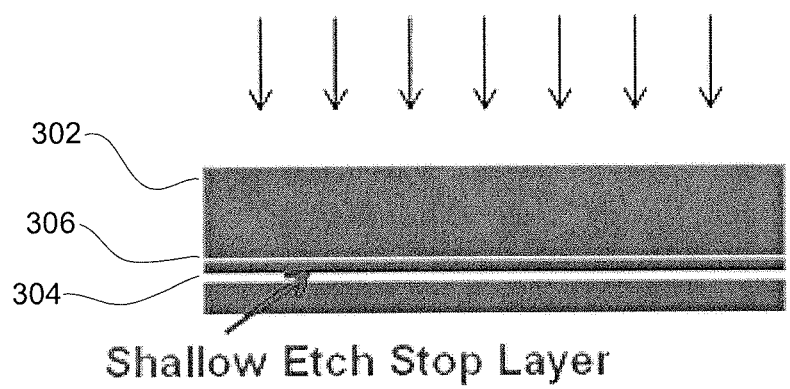
Figure 3D:
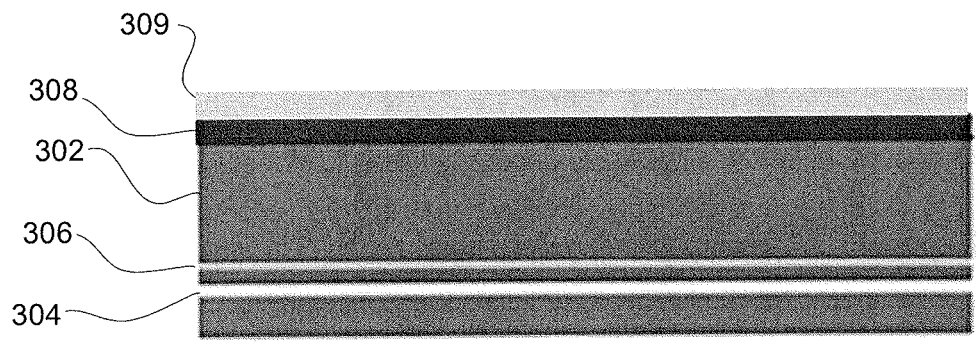
Figure 3E:
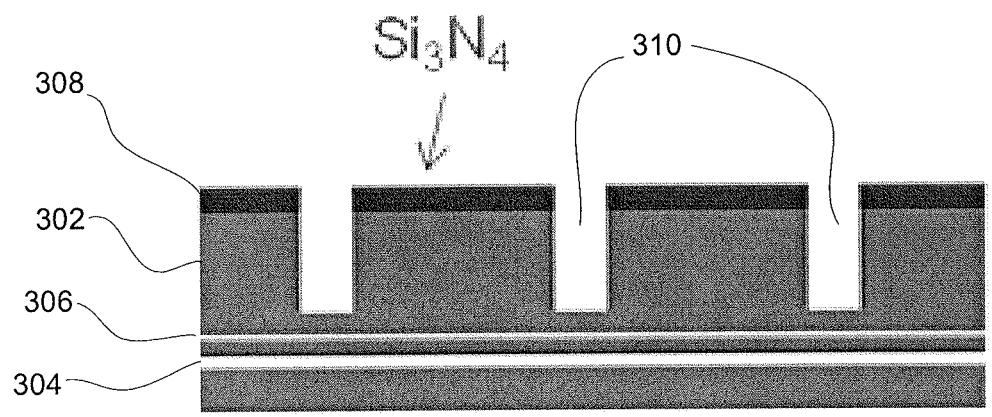
Figure 3F:
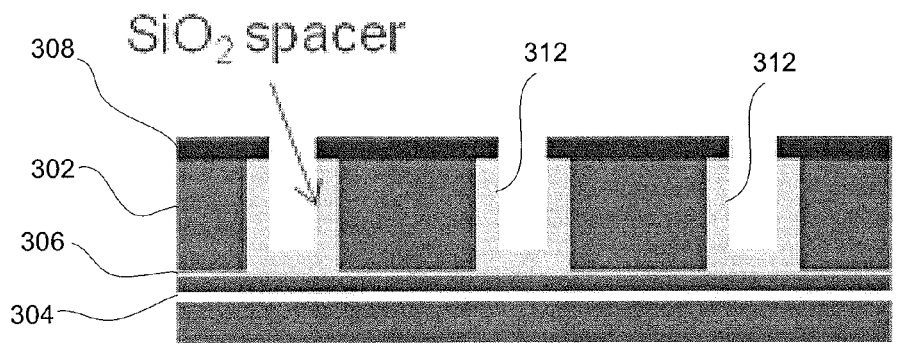
Figure 3G:
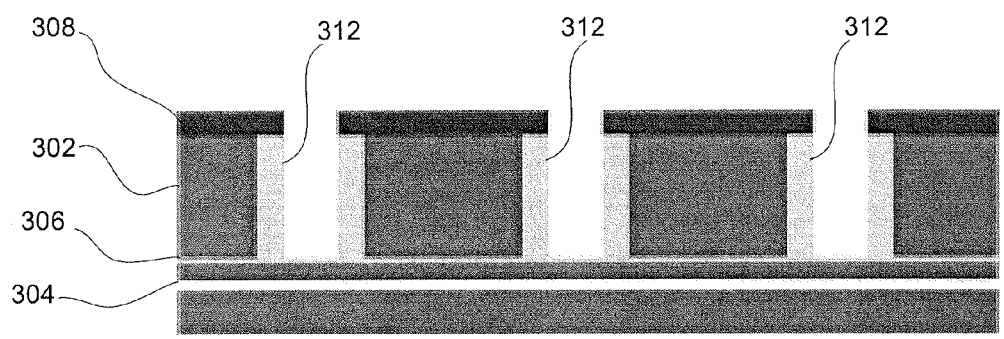
Figure 3H:
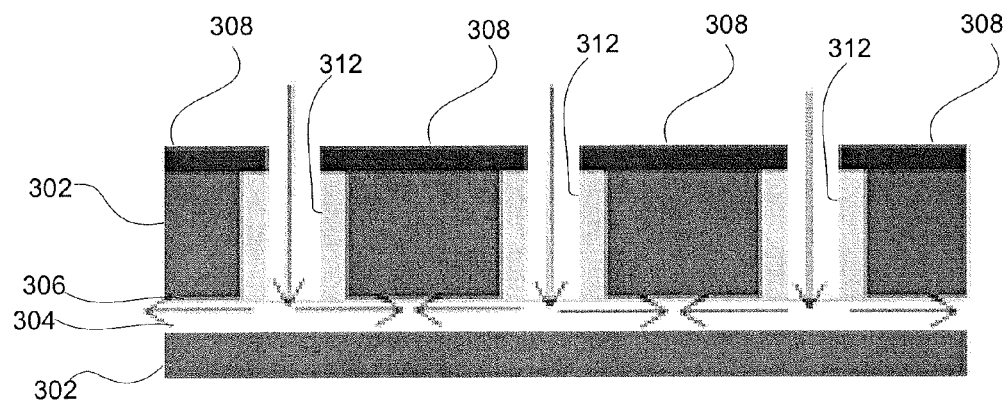
Figure 3I:
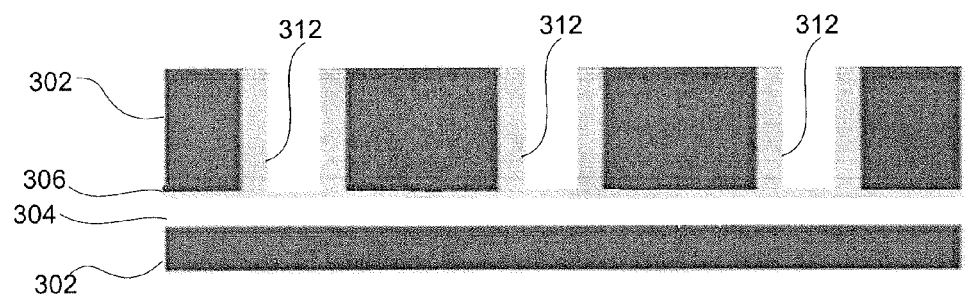
Figure 3J:
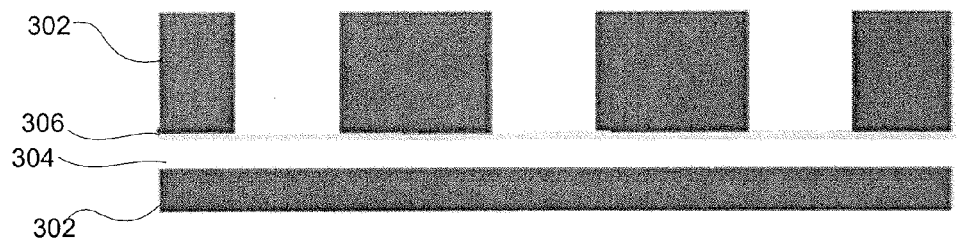

In one embodiment, the second etch stop layer 306 may be configured to be parallel to the first etch stop layer 304. In such an embodiment, a silicon layer may be formed between the first etch stop layer 304 and the second etch stop layer 306. The positions of the first etch stop layer 304 and the second etch stop layer 306 may control the depth of the mechanically flexible silicon substrate. The formed first etch stop layer 304 and the second etch stop layer 306 in the substrate 302 are shown in FIG. 3C.

In one embodiment, the method 200 may further include forming 208 a hard mask layer 308 over a surface of the silicon substrate 302. The hard mask layer 308 may be in parallel to the first etch stop layer 304 and the second etch stop layer 306. In one embodiment, the hard mask layer 308 may be a $Si_3N_4$ layer. In an alternative embodiment, the hard mask layer 308 may be an oxide layer. One of ordinary skill in the art may recognize other materials for the hard mask layer 308. The method 200 may further include forming 209 a photoresist layer 309 over the hard mask layer 308.

The method 200 may further include etching 210 the silicon substrate to form one or more trenches 310 over the second etch stop layer 306. The etching 210 may be through the photoresist layer 308, the hard mask layer 308, and silicon layer over the second etch stop layer 306. The method may further include removing 211 the photoresist layer 309. In one embodiment, the top of the one or more trenches 301 may be at the same level with the top of the hard mask layer 308. In one embodiment, etching 210 the silicon substrate may include RIB. In an another embodiment, etching 210 the silicon substrate may include DRIB. One of ordinary skill in the art may recognize other anisotropic etching methods to form the trenches 310.

In one embodiment, the method 200 may further include oxidizing 212 the silicon substrate 302 to form a vertical sidewall layer 312 on the exposed silicon inside the one or more trenches 310. In one embodiment, if the vertical sidewall is a silicon dioxide then oxidizing 212 the silicon substrate 302 may include baking the substrate 302 in an oxygen rich environment.

The method 200 may further include removing 214 the vertical sidewall layer 312 on the bottom of each of the one or more trenches 310. In one embodiment, removing the vertical sidewall layer 312 on the bottom of each of the one or more trenches 310 may include RIE. One of ordinary skill in the art may recognize other alternatives to remove the vertical sidewall layer 312 on the bottom of each of the one or more trenches 310.

In one embodiment, the method 200 may further include removing 216 the silicon layer between the first etch stop layer 304 and the second etch stop layer 306. In one embodiment, removing 216 the silicon layer between the first etch stop layer 304 and the second etch stop layer 306 may include etching the silicon layer with hydrazine. The method 200 may also include removing 218 the hard mask layer 308. The method 200 may further include removing 220 the vertical sidewall layer 312 inside each of the one or more trenches 310. The method 200 may also include detaching 221 the top silicon layer from the substrate.

In one embodiment, the silicon substrate formed by method 200 may mechanical flexible. In one embodiment, the silicon substrate formed by method 200 may be optically transparent. The silicon substrate formed by method 200 may also be porous. In another embodiment, the method 200 may also be used to produce high performance electronics directly on flexible silicon without any transfer or such process.

Figure 4:
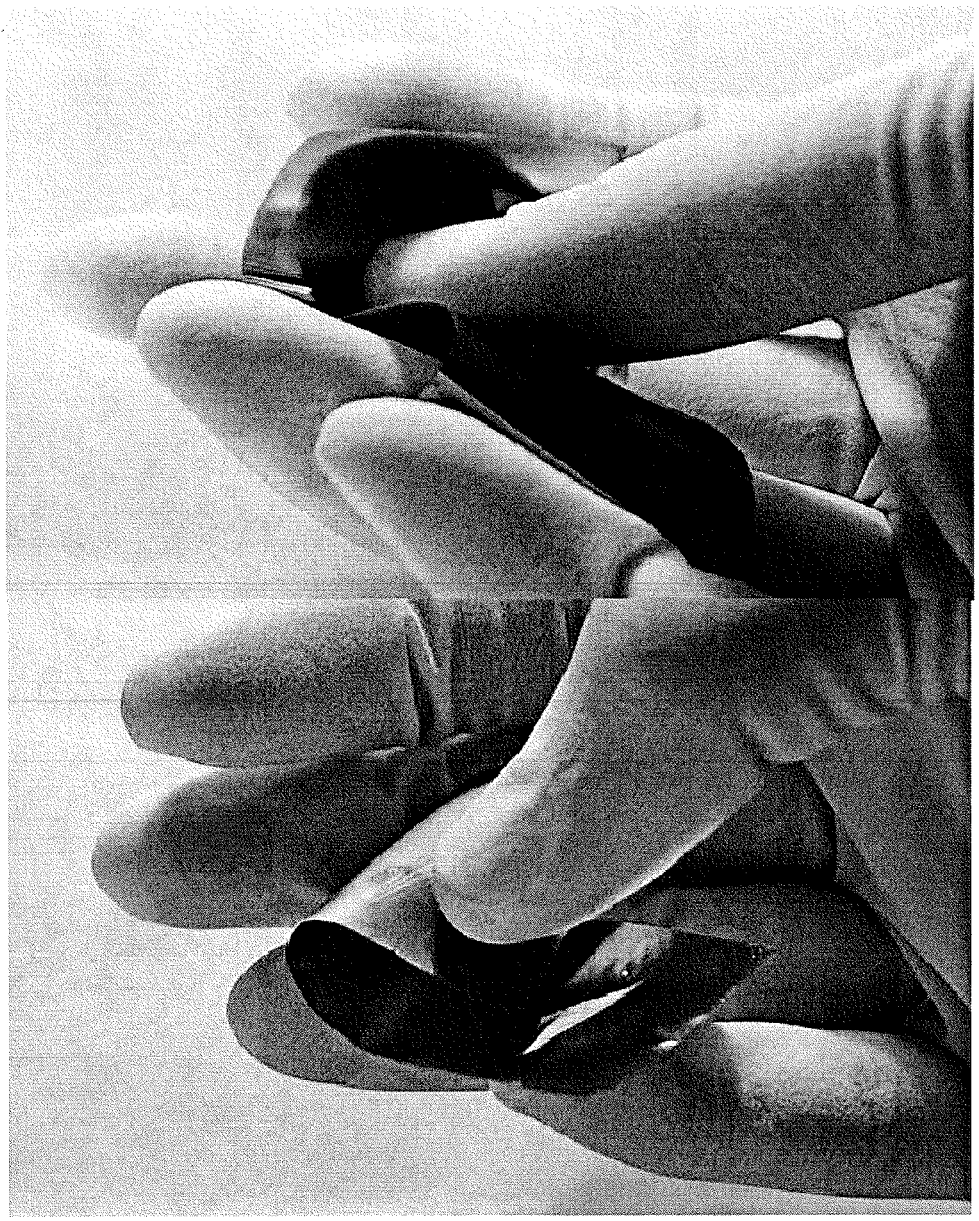
FIG. 4 shows one embodiment of a mechanically flexible silicon substrate.
Figure 5:
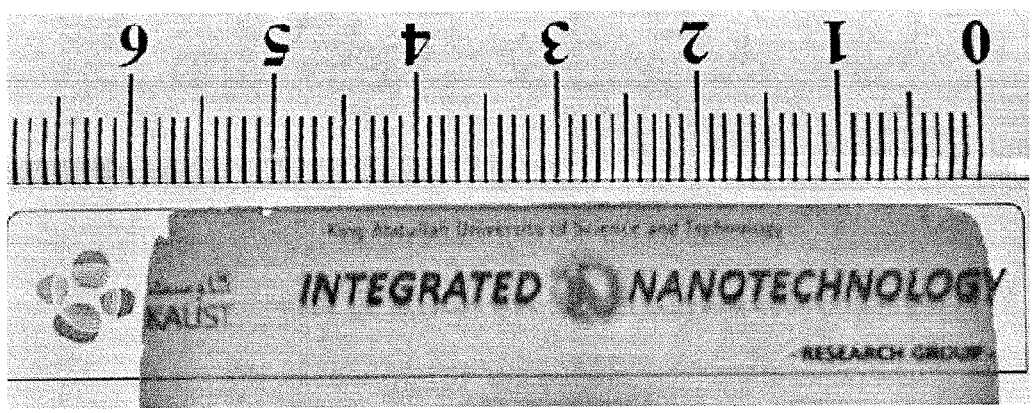
FIG. 5 shows one embodiment of an optically transparent silicon substrate.

FIGS. 4 and 5 show the silicon substrate produced by method 200. As can be seen from FIG. 4, the produced silicon substrate is mechanically flexible. FIG. 5 shows that the produced silicon substrate is optically transparent.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

The invention claimed is:

1. A method for making a thin silicon substrate, comprising:
   providing a silicon substrate;
   forming a first etch stop layer in a bulk portion of the silicon substrate;
   forming a second etch stop layer in the bulk portion of the silicon substrate;
   forming one or more trenches over the first etch stop layer and the second etch stop layer;
   removing the silicon substrate of the bulk portion between the first etch stop layer and the second etch stop layer by delivering chemical etchant through the formed one or more trenches; and
   detaching a top silicon layer from the silicon substrate to form the thin silicon substrate.

2. The method of claim 1, wherein the thin silicon substrate is flexible.

3. The method of claim 2, further comprising producing high performance electronics directly on the flexible thin silicon substrate without any transfer process.

4. The method of claim 1, wherein forming the first etch stop layer comprises implanting ions into the silicon substrate at a first depth.

5. The method of claim 4, wherein forming the second etch stop layer comprises implanting ions into the silicon substrate at a second depth between the first depth and a surface of the silicon substrate, wherein the first etch stop layer and the second etch stop layer define a channel for delivery of the chemical etchant to remove the silicon substrate, and wherein at least one of the first depth and the second depth define, in part, a thickness of the formed thin silicon substrate.

6. The method of claim 1, wherein the first etch stop layer comprises a Boron layer.

7. The method of claim 1, wherein the second etch stop layer comprises a Boron layer.

8. The method of claim 1, wherein forming one or more trenches comprises forming a protective layer over the silicon substrate.

9. The method of claim 8, further comprising forming a photoresist layer over the protective layer.

10. The method of claim 9, further comprising etching the photoresist layer, the protective layer and a portion of the silicon substrate.

11. The method of claim 10, further comprising removing the photoresist layer.

12. The method of claim 11, further comprising forming a vertical sidewall layer inside each of the one or more trenches.

13. The method of claim 12, further comprising removing a portion of the vertical sidewall layer.

14. The method of claim 13, further comprising removing the protective layer.

* * * * *